(12) United States Patent
Goishi

(10) Patent No.: US 6,249,533 B1
(45) Date of Patent: *Jun. 19, 2001

(54) PATTERN GENERATOR

(75) Inventor: Masaru Goishi, Oura-gun (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,323

(22) PCT Filed: Nov. 28, 1997

(86) PCT No.: PCT/JP97/04367

§ 371 Date: Jul. 27, 1998

§ 102(e) Date: Jul. 27, 1998

(87) PCT Pub. No.: WO98/23968

PCT Pub. Date: Jun. 4, 1998

(30) Foreign Application Priority Data

Nov. 29, 1996 (JP) .................................... 8-319249

(51) Int. Cl.[7] ............................ G01R 31/28; G06F 11/00
(52) U.S. Cl. .............................................................. 370/743
(58) Field of Search ................................... 714/724, 730, 714/732, 739, 738, 742, 743; 370/241, 242, 252, 253, 475

(56) References Cited

U.S. PATENT DOCUMENTS 4,586,181 * 4/1986 Shimizu ............................. 714/743
4,670,879 * 6/1987 Okino ................................. 714/743
4,692,920 * 9/1987 Tannahaeuser et al. ............ 714/743
5,265,102   11/1993 Saito .
5,321,700   6/1994 Brown et al. .
6,019,501 * 2/2000 Okazaki ............................. 714/718
6,094,738 * 7/2000 Yamada et al. .................... 714/738

FOREIGN PATENT DOCUMENTS 59-225368   12/1984 (JP) .
61-241674   10/1986 (JP) .
 5-72286     3/1993 (JP) .
 6-30786     4/1994 (JP) .
6130127      5/1994 (JP) .
8271592     10/1996 (JP) .

* cited by examiner

Primary Examiner—Ricky Ngo
(74) Attorney, Agent, or Firm—Gallagher & Lathrop; David N. Lathrop

(57) ABSTRACT

There is provided a pattern generator which is capable of utilizing memory blocks connected to unused pins of a DUT. A pattern address from a vector generation control 1 and a control signal from a control table buffer 2 are used to control an address converter 9 to convert a pattern address PA into plural-bit addresses a, b and c. The address a or b is provided to m memory blocks 10 (m being an integral multiple of the number n of pins of the DUT) to generate therefrom pattern data. The pieces of pattern data thus outputted from the memory blocks are selected by sequence data from one of n sequence register, and the selected pattern data is applied to the corresponding pin of the DUT 8 after being converted by a frame processor 7 into a waveform suitable for application to the DUT.

8 Claims, 9 Drawing Sheets

| NUMBER OF PINS USED | PATTERN CAPACITY (MW) | OPERATING FREQUENCY (MHz) |
|---|---|---|
| Full | 2 s | 2 f |
| 1/2 | 4 s | 4 f |
| 1/4 | 8 s | 8 f |
| 1/8 | 16 s | 16 f |
| 1/16 | 32 s | 32 f |
| 1/32 | 64 s | 64 f |
| 1/64 | 128 s | 128 f |

FIG. 4

PATTERN GENERATOR

TECHNICAL FIELD

The present invention relates to a pattern generator for use in a semiconductor device testing apparatus for testing semiconductor devices (semiconductor integrated circuits, for instance), which generates a test signal having a predetermined pattern and an address signal both of which are to be applied to a semiconductor device to be tested (commonly called DUT), an expected value signal having a predetermined pattern to be supplied to logical comparator means, and the like.

BACKGROUND ART

As is well known in the art, a semiconductor device testing apparatus (commonly called device tester or IC tester) uses a pattern generator which generates a test signal having a predetermined pattern, an address signal and a control signal all of which are to be applied to a semiconductor device under test (hereinafter referred to as DUT), an expected value signal having a predetermined pattern to be supplied to logical comparator means, and the like.

FIG. 9 is a block diagram schematically depicting the circuit configuration of an example of the conventional pattern generator of this type. This pattern generator comprises a vector generation control (VGC) 1, a control table buffer (CTB) 2, a group of test pattern storages or truth table buffers (TTB) 3, a scan pattern generator (SCPG) 4, a programmable data selector (PDS) 5, a group of OR circuits 6, and a group of frame processors (FP) 7. The truth table buffers 3, the OR circuits 6 and the frame processors 7 are prepared equal in their number to the number of pins of a DUT 8.

The vector generation control 1 has instructions previously stored therein for controlling a pattern generation sequence in a pattern program, and normally generates an address of pattern data stored in one of the truth table buffers 3. In addition, it controls the scan pattern generator 4, etc. Further, the truth table buffers 3 have pattern data previously stored therein which are necessary for causing the pattern generator to generate various test patterns therefrom.

In the control table buffer 2 there are previously stored a match (coincidence) mode designation instruction and a timing switching instruction that are control signals in the pattern program. The match mode mentioned herein refers to a mode in which, when an output signal from the DUT 8 coincides with an expected value signal, the test pattern generation sequence of a functional test is altered in real time.

The scan pattern generator 4 is an optional hardware for storing and generating a scan pattern which is necessary for implementing LSSD (level sensitive scan design that is a scan design scheme developed by IBM Inc. of United States). The scan pattern refers to a pattern that is applied to a test pin or pins added to a device which can undergo a scan path test. The scan path test refers to a test simplified procedure or scheme which permits simplification of the test by connecting in series all of flip-flops of logical circuits in a DUT to operate them as a shift register which means equivalently a combination circuit of all of the flip-flops.

The programmable data selector 5 is a hardware for assigning a scan pattern or a test pattern generated from the scan pattern generator 4 to a desired pin or pins of the DUT 8.

The frame processors 7 are pin signal waveform generating parts each of which generates a waveform of the test pattern to be applied to each pin of the DUT 8 for each frame (a basic unit having a width of one test period). Conventionally, the frame processors are constructed by a combination of a format controller, a timing generator, a logical comparator and a calibration unit. As compared with a conventional shared tester (a device tester of the type in which plural resources such as a timing generator, a reference voltage and the like are used in common to respective pins of a DUT), the frame processors are capable of outputting free timing signals and waveforms independently of respective pins of the DUT.

In the conventional pattern generator of the above construction, the same plurality of the truth table buffers 3, the OR circuits 6 and the frame processors 7 are prepared respectively, the number being equal to that of pins of the DUT 8, and one truth table buffer 3, one OR circuit 6 and one frame processor 7 are connected to each pin of the DUT 8. That is, the truth table buffers 3, the OR circuits 6 and the frame processors 7 are fixedly connected to the pins of the DUT 8 in a one-to-one correspondence relationship between them. Accordingly, when some of the pins of the DUT 8 are unused, the truth table buffers 3, the OR circuits 6 and the frame processors 7 corresponding to such unused pins are left connected thereto. As a result, in case the number of unused pins is large, considerably large numbers of truth table buffers 3, OR circuits 6 and frame processors 7 are being wastfully used.

Incidentally, a test pattern of large capacity may sometimes be required even if a DUT uses at present only a small number of pins, leaving the remaining large number of pins unused. The truth table buffers 3 have previously stored therein various test patterns as mentioned above, and hence if the number of truth table buffers 3 that can be used is small, it is difficult to generate a large capacity test pattern.

As a solution to this problem, it is customary in the prior art to add the scan pattern generator 4 and the programmable data selector 5 to the pattern generator as described above, so that the scan pattern generator 4 can generate a large capacity test pattern suitable for testing the DUT 8 and the programmable data selector 5 assigns the test pattern from the scan pattern generator 4 to a desired pin or pins of the DUT 8. It is needless to say that the scan pattern generator 4 is also used in performing the scan path test.

However, the provision of the scan pattern generator 4 has a drawback that the entire tester arrangement becomes expensive because the scan pattern generator 4 is costly. Furthermore, it is necessary not only to prepare and store a program for the generation of test patterns from the scan pattern generator 4 but also to store a control signal—this inevitably leads to the shortcoming of cumbersome and inefficient task involved. Still another defect resides in that the generation of test patterns from the scan pattern generator 4 lacks flexibility in operation.

DISCLOSURE OF THE INVENTION

An object of the present invention is to provide a pattern generator adapted to make available pattern memories connected to unused pins of a DUT, permitting generation of a test pattern of large capacity without need for using any scan pattern generator that is an optional hardware.

Another object of the present invention is to provide a pattern generator which need not use any scan pattern generator that is an optional hardware, is low-cost, and yet is capable of generating a test pattern of large capacity and high-speed.

According to the present invention, in order to accomplish the above objects, there is provided a pattern generator comprising: address generating means for generating a pattern address; control signal generating means for generating a control signal; address converting means for converting a pattern address from the address generating means into at least first and second address signals on the basis of a control signal from the control signal generating means, each of the address signals being composed of a plurality of bits; m memory means (m being an integral multiple of the number n of pins of a semiconductor device under test) each having predetermined pattern data previously stored therein and responsive to the first address signal supplied thereto to generate corresponding pattern data; n sequence registers responsive to the second address signal supplied thereto to generate data of a preset sequence; and n select means each selecting one of the memory means depending upon the preset sequence data outputted from the sequence registers, and applying to corresponding one of pins of the semiconductor device under test a test pattern based on pattern data stored in the selected memory means.

In the second embodiment of the present invention, each of the n sequence registers is constructed such that it can set therein a plurality of sequences, and one of the plurality of sequences is selected from each sequence register depending upon an address signal applied thereto and the selected sequence is supplied to corresponding one of the select means.

In the third embodiment of the present invention, there are further included n pattern storage means each having previously stored therein pattern data for generating a pattern having a relatively small capacity to be supplied to a pin of a semiconductor device under test other than a pin or pins thereof to which a scan pattern is applied, and the scan pattern is generated from the memory means and a pattern or patterns other than the scan pattern are generated from the pattern storage means.

In a preferred first embodiment of the present invention, the n select means comprise: n multiplexers selecting the memory means in accordance with sequence data outputted from the sequence registers, respectively; and n frame processors converting the pattern data stored in the memory means selected by the multiplexers into test patterns each having a waveform suitable for application to a semiconductor device under test, the test patterns being applied to corresponding pins of the semiconductor device under test, respectively.

In addition, the address converting means generates, in addition to the first and second address signals, a third address signal for access to the memory means, and the third address signal serves to cause the memory means to generate pattern data corresponding to a scan pattern to be supplied to a pin of a semiconductor device under test to which the scan pattern is applied.

Moreover, the address generating means is a vector generation control for generating an address of pattern data stored in each of the memory means, and the control signal generating means is a control table buffer for generating a control signal for controlling the address converting means, the address converting means being controlled by the control signal from the control table buffer and the address of pattern data from the vector generation control, thereby to generate the address signal. And each of the memory means is a memory block, a selecting order of these memory blocks being previously set in each of the sequence registers as one sequence for each pin of a semiconductor device under test.

In a modified embodiment of the present invention, there are provided a plurality of circuits each of which is constituted by the address converting means, the memory means, the sequence registers and the multiplexers, and the plurality of circuits is arranged such that a pattern can be generated from each of the circuits independently of others.

BRIEF DESCRIPTION OF THE DRAWINGS

FIG. 4 is a diagram showing the relationships between the number of used pins of the DUT, the pattern capacity for each pin and the operating frequency in the pattern generator depicted in FIG. 1;

BEST MODE FOR CARRYING OUT THE INVENTION

Figure 1:
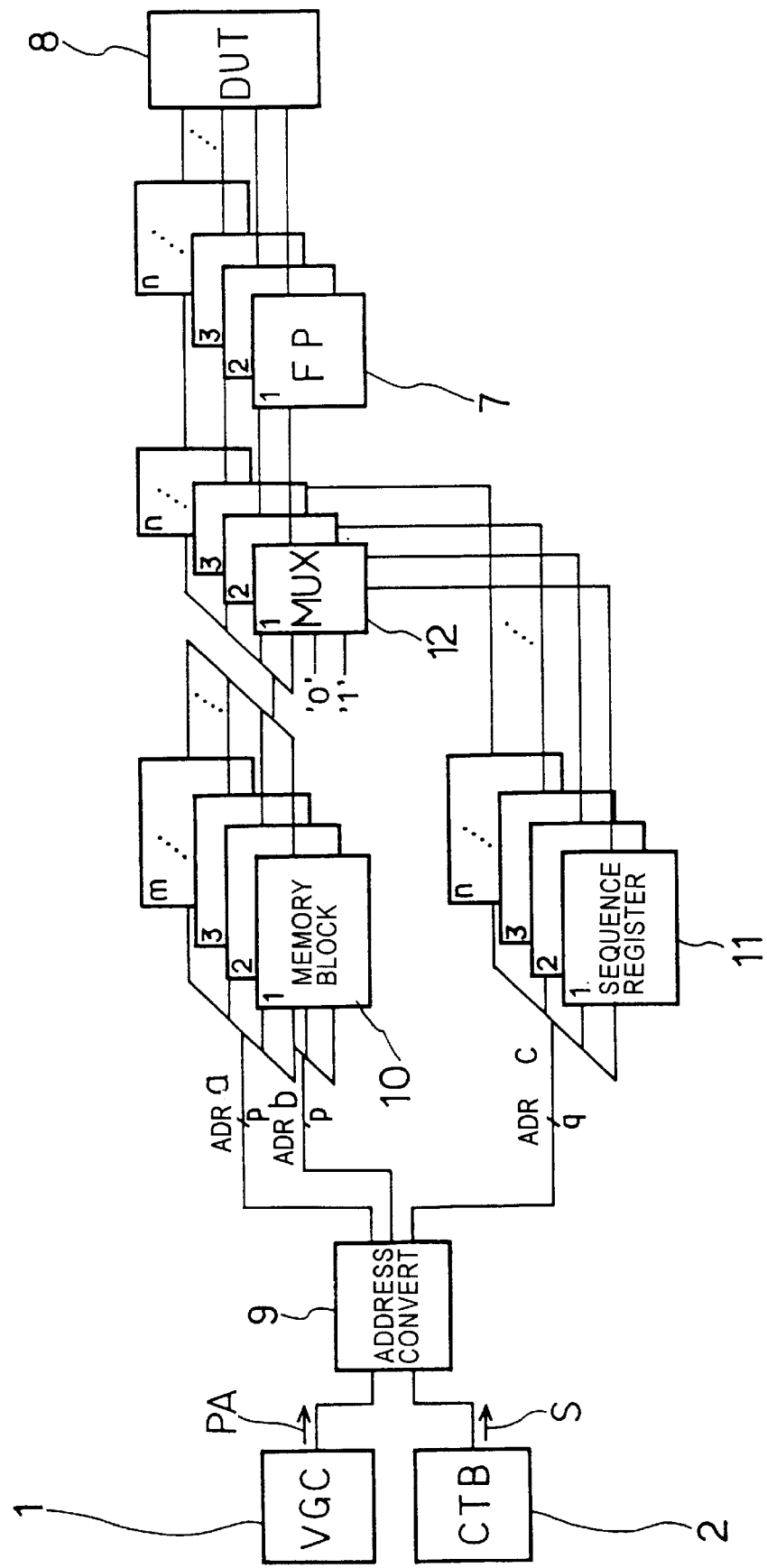
FIG. 1 is a block diagram showing the general configuration of a first embodiment of the pattern generator according to the present invention.

Now embodiments of the pattern generator according to the present invention will be described in detail with reference to the accompanying drawings. For the sake of brevity, the portions, parts and elements in FIGS. 1, 6, 7 and 8 corresponding to those in FIG. 9 will be identified by the same reference characters and the descriptions thereof will be omitted unless necessary.

FIG. 1 illustrates in block form the general configuration of a first embodiment of the pattern generator according to the present invention. The pattern generator depicted in FIG. 1 is also provided with the vector generation control 1 for generating an address signal PA of pattern data, the control table buffer 2 for generating a control signal S, and the frame processors 7 for converting pattern data into waveforms. The frame processors 7 are prepared as many as the number n of pins of a DUT 8.

The pattern generator of the present invention further comprises m memory blocks 10 for storing pattern data (where m is an integral multiple of n), sequence registers 11 of the same number as the number n of pins of the DUT 8 for controlling the access to the m memory blocks 10, multiplexers (MUX) 12 of the same number as the number n of pins of the DUT 8 for selecting a specified one of the m memory blocks 10, and an address converter 9 for converting the address signal PA of the pattern data into addresses of the m memory blocks 10 on the basis of the control signal S from the control table buffer 2. Accordingly, the sequence registers 11 and the multiplexers 12 have a one-to-one correspondence relationship to the pins of the DUT 8.

The address signal PA of pattern data from the vector generation control 1 and the control signal S from the control table buffer 2 are each converted by the address converter 9 to an address a of high order p bits, an address b and an address c of low order q bits, where p is the address width of each of the memory blocks 10 and q the bit width with which it is possible to access the capacity of each sequence register 11.

The address a is one that is used to access the memory blocks 10 other than those assigned for the scan pattern generation described previously in respect of the prior art, and is a high order address of the pattern data address signal PA.

The address b is one that is used to access the memory blocks assigned for the scan pattern generation, and is incremented by a control signal that is generated by the control table buffer 2 to generate the next scan pattern.

The address c is one that is used to access the sequence registers 11, and is a low order address of the pattern data address signal PA.

In each of the m memory blocks 10 there is stored pattern data for the generation of such patterns as a test pattern and a scan pattern; the pattern data is read out of the memory block when it is supplied with the address a.

Figure 2:
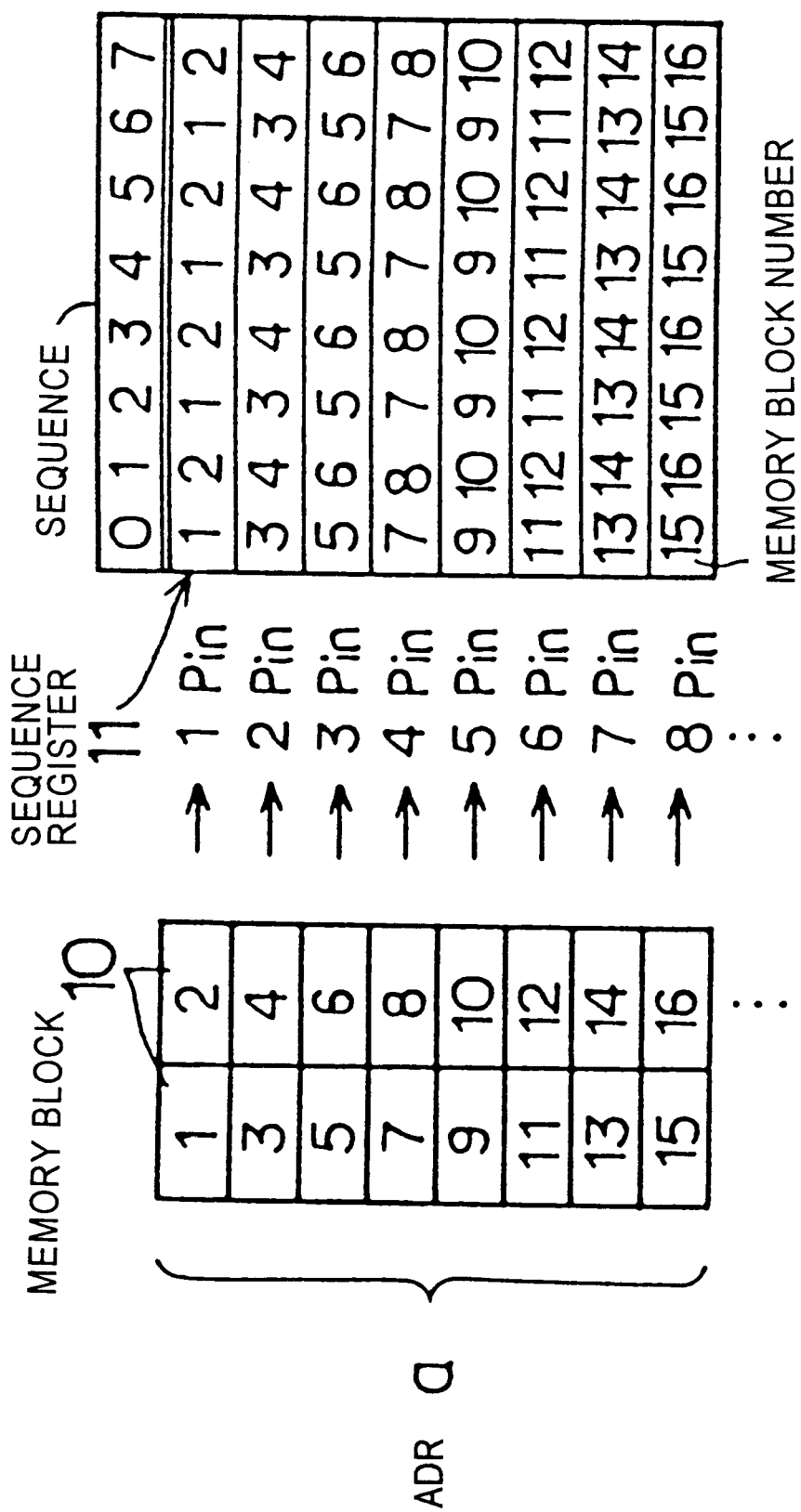
FIG. 2 is a diagram depicting how memory blocks of the same capacity assigned to all pins of a DUT are selected by an address a and an example of memory block numbers set in one of sequence registers in the pattern generator shown in FIG. 1.
Figure 3:
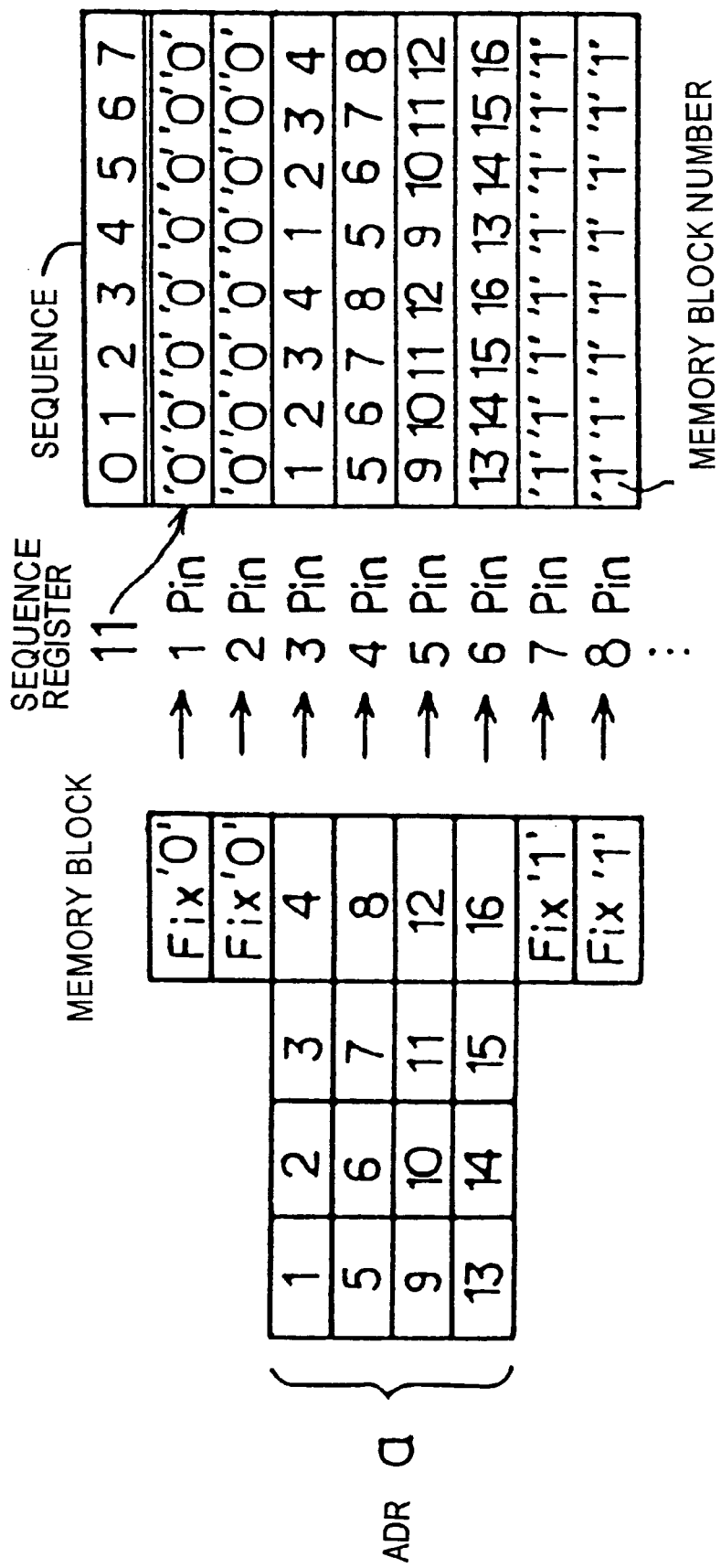
FIG. 3 is a diagram depicting how memory blocks of the same capacity assigned to some of the pins of the DUT are selected by the address a and an example of memory block numbers set in one of the sequence registers in the pattern generator shown in FIG. 1.
Figure 5:
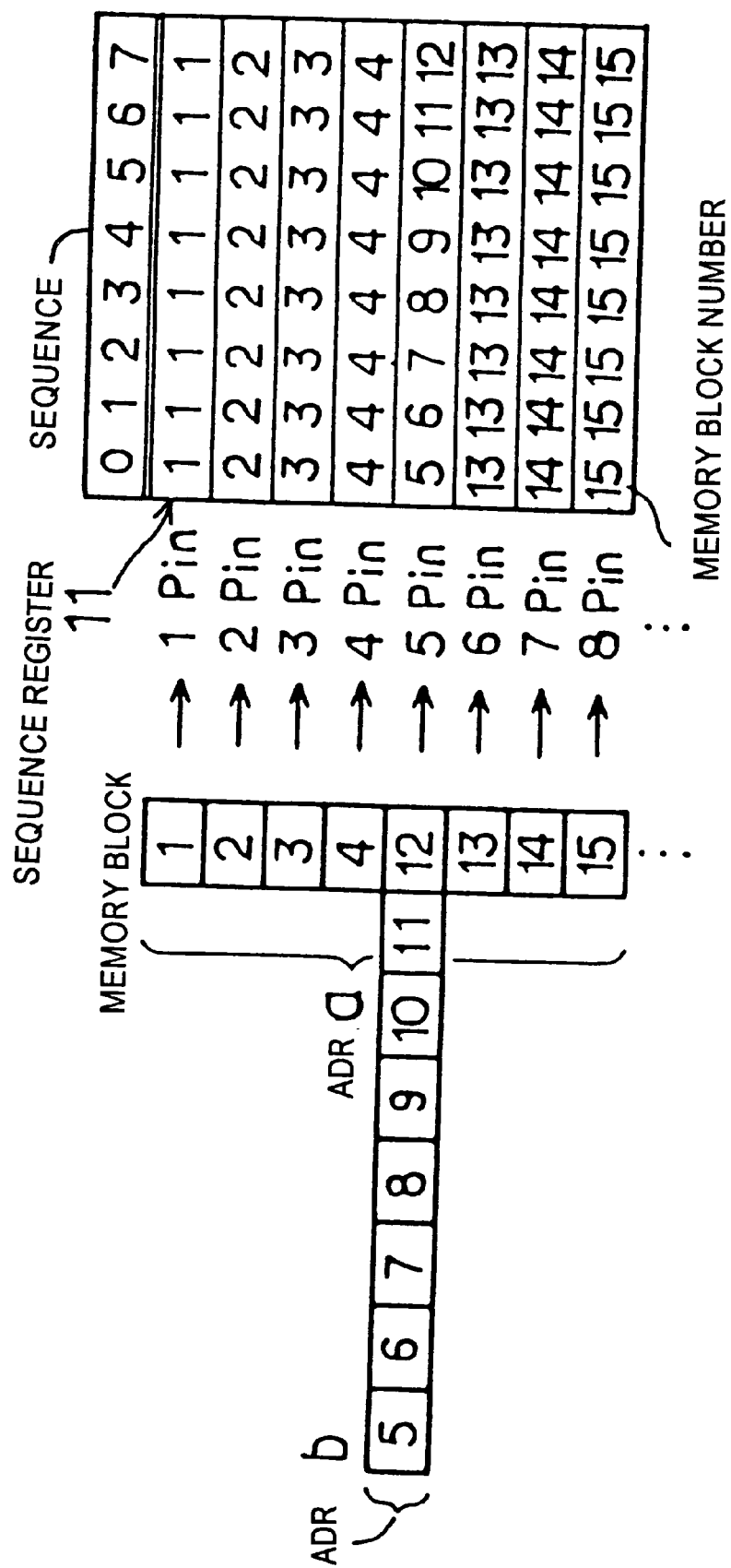
FIG. 5 is a diagram depicting how large capacity memory blocks assigned to scanning pins of the DUT are selected by the addresses a and b and an example of memory block numbers set in one of the sequence registers in the pattern generator shown in FIG. 1.

The sequence registers 11 of the same number n (1, 2, . . . , n) as that n of pins of the DUT 8 are provided as mentioned above, and in this embodiment each sequence register has stored therein, as one sequence for each pin of the DUT 8, the numbers 1, 2, . . . , n of the memory blocks 10 to be selected as depicted in FIGS. 2, 3 and 5. These pieces of data stored in the respective sequence registers are read out by applying thereto the address c. In this embodiment the n sequence registers 11 are each so constructed as to store one sequence consisting of eight pieces of data 0 to 7. Accordingly, the address c has a bit width q with which it is possible to read out the eight pieces of data stored in each sequence register.

The multiplexers 12 of the same number n (1, 2, . . . n) as that n of pins of the DUT 8 each respond to the sequence data read out of the sequence register corresponding thereto to select a specified one of the m memory blocks 10 and supply the pattern data from the selected memory block to the frame processor corresponding thereto. The n (1, 2, . . . , n) frame processors 7 each convert the pattern data fed thereto into a waveform suitable for application to the corresponding pin of the DUT 8, and then provides thereto the pattern data of the converted waveform.

FIG. 2 shows, in correspondence to the pins 1, 2, . . . n of the DUT 8, the mode of selection of the memory blocks 10 by the address a and an example of the memory block numbers set in one of the sequence registers 11 in the case where memory blocks of the same capacity are assigned to all the pins 1, 2, . . . , n of the DUT 8. This is an example of operation when the number m of memory blocks is set twice larger than the number n of pins of the DUT 8, that is, when m=2n.

Since the memory blocks 10 are twice as many as the pins of the DUT 8, they are assigned in pairs to the pins. The memory blocks 1 and 2 are assigned to the pin 1, the memory blocks 3 and 4 to the pin 2, and the memory blocks 5 and 6 to the pin 3, the succeeding memory blocks being similarly assigned in pairs to the remaining pins in a sequential order. In the sequence register 11 the memory block numbers are stored, for the pin 1, in such a manner as to select the memory block 1 at position 0 corresponding to first data 1, the memory block 2 at position 1 corresponding to second data 2, the memory block 1 at position 2 corresponding to third data 3, the memory block 2 at position 3 corresponding to fourth data 4 and the memory blocks 1 and 2 at positions (4 to 7) corresponding to the subsequent occurrence of data, respectively. The same applies to the other remaining pins.

The memory blocks have the same capacity; letting the capacity of each memory block be represented by s (MW) and the maximum operating frequency by f (MHz), the pattern capacity and maximum operating frequency of the device tester in FIG. 2 are 2s (MW) and 2f (MHz), respectively.

FIG. 3 shows, in correspondence to the pins 1, 2, . . . , n of the DUT 8, the mode of selection of the memory blocks 10 by the address a and an example of the memory block numbers set in one of the sequence registers 11 in the case where memory blocks of the same capacity are assigned to some, in this example, half of the pins 1, 2, . . . , n of the DUT 8. In this example, too, the number m of memory blocks is set twice larger than the number n of pins of the DUT 8.

Since the memory blocks 10 are twice as many as the pins of the DUT 8, they are assigned to each pin in groups of four when the half of the pins are used. In FIG. 3 it is assumed that the pins 1, 2, 7 and 8 are unused, whereas the pins 3, 4, 5 and 6 are used. In both of the memory blocks 10 and the sequence registers 11 fixed values "0's" (Fix '0' and '0') are stored for the unused pins 1 and 2 and fixed values "1's" (Fix '1' and '1') are stored for the unused pins 7 and 8. These fixed values "0's" and "1's" stored in the memory blocks are not read out therefrom since the address a is not provided thereto.

On the other hand, the memory blocks 1, 2, 3, 4, the memory blocks 5, 6, 7, 8, the memory blocks 9, 10, 11, 12, and the memory blocks 13, 14, 15, 16 are assigned to the used pins 3, 4, 5 and 6, respectively; similarly, the memory blocks are assigned by steps of four to the other remaining pins. In the sequence register 11 the memory block numbers are stored, for the pin 3, in such a manner as to select the memory block 1 at position 0 corresponding to first data 1, the memory block 2 at position 1 corresponding to second data 2, the memory block 1 at position 2 corresponding to third data 3, the memory block 2 at position 3 corresponding to fourth data 4 and the memory blocks 1 and 2 at positions (4 to 7) corresponding to the subsequent occurrence of data, respectively. The same applies to the other remaining pins.

The memory blocks have the same capacity; letting the capacity of each memory block be represented by s (MW) and the maximum operating frequency by f (MHz), the pattern capacity and maximum operating frequency of the device tester in FIG. 3 are 4s (MW) and 4f (MHz), respectively.

In FIG. 4 there are shown the relationships between the pattern capacity and maximum operating frequency of the device tester in the cases where the number of pins used is ¼, ⅛, 1/16, 1/32 and 1/64 of the total number of pins, together with the corresponding relationships in the cases of FIGS. 2 and 3 (Full indicates the case of using all the pins). It will be clearly understood from FIG. 4 that as the number of pins used decreases, the pattern capacity and maximum operating frequency of the device tester increase.

Next, a description will be given, with reference to FIG. 5, of the case where a large capacity memory is assigned to the test pin of the DUT 8 to which the scan pattern is applied.

FIG. 5 shows, in correspondence to the pins 1, 2, ..., n of the DUT 8, the mode of selection of the memory blocks by the addresses a and b and an example of the memory block numbers set in one of the sequence registers 11 in the case where eight memory blocks are assigned to the test pin of the DUT 8 to which the scan pattern is applied, for example, to the pin 5 and one memory block is assigned to each of the pins other than the test pin. In this example, too, the number m of memory blocks is set twice larger than the number n of pins of the DUT 8.

The memory block 1 is assigned to the pin 1, the memory block 2 to the pin 2, the memory block 3 to the pin 3, the memory block 4 to the pin 4, eight memory blocks 5, 6, ..., 12 to the pin 5, and the memory block 13 to the pin 6; likewise, the remaining memory blocks are assigned one after another to one of the pin 7 and those succeeding it.

In the sequence register 11 the memory block numbers are so stored as to select the memory block 1 at each of positions 0 to 7 for the pin 1, the memory block 2 at each of positions 0 to 7 for the pin 2, the memory block 3 at each of positions 0 to 7 for the pin 3, and the memory block 4 at each of positions 0 to 7 for the pin 4, but for the pin 5, the memory block numbers are stored in such a manner as to select the memory block 5 at position 0, the memory block 6 at position 1, the memory block 7 at position 2, the memory block 8 at position 3, and the blocks 9 to 12 at positions 4 to 7, respectively. As for the other remaining pins including the pin 6, the memory block numbers are stored in the same manner as in the cases of the pins 1 to 4.

The memory blocks have the same capacity; letting the capacity of each memory block be represented by s (MW) and the maximum operating frequency by f (MHz), the pattern capacity of the device tester in the case of FIG. 5 is 8s (MW) in the scan path test and s (MW) in other tests and the maximum operating frequency is f (MHz).

As described above, according to the present invention, the pattern capacity and the maximum operating frequency of the device tester are variable according to the number of pins of the DUT 8 used, so that resources of the device tester can effectively be utilized. Since the number m of the memory blocks is set to an integral multiple of the number n of pins of the DUT 8, a large capacity test pattern can easily be generated at high speed. Further, since the pins of the DUT 8 can be switched by the multiplexers 12 without changing pattern data, this offers flexibility in that the same pattern data can be used to measure DUTs which differ only in pin arrangement. Additionally, the scan path test can be conducted without using the scan pattern generator and the programmable data selector needed in the prior art.

Figure 6:
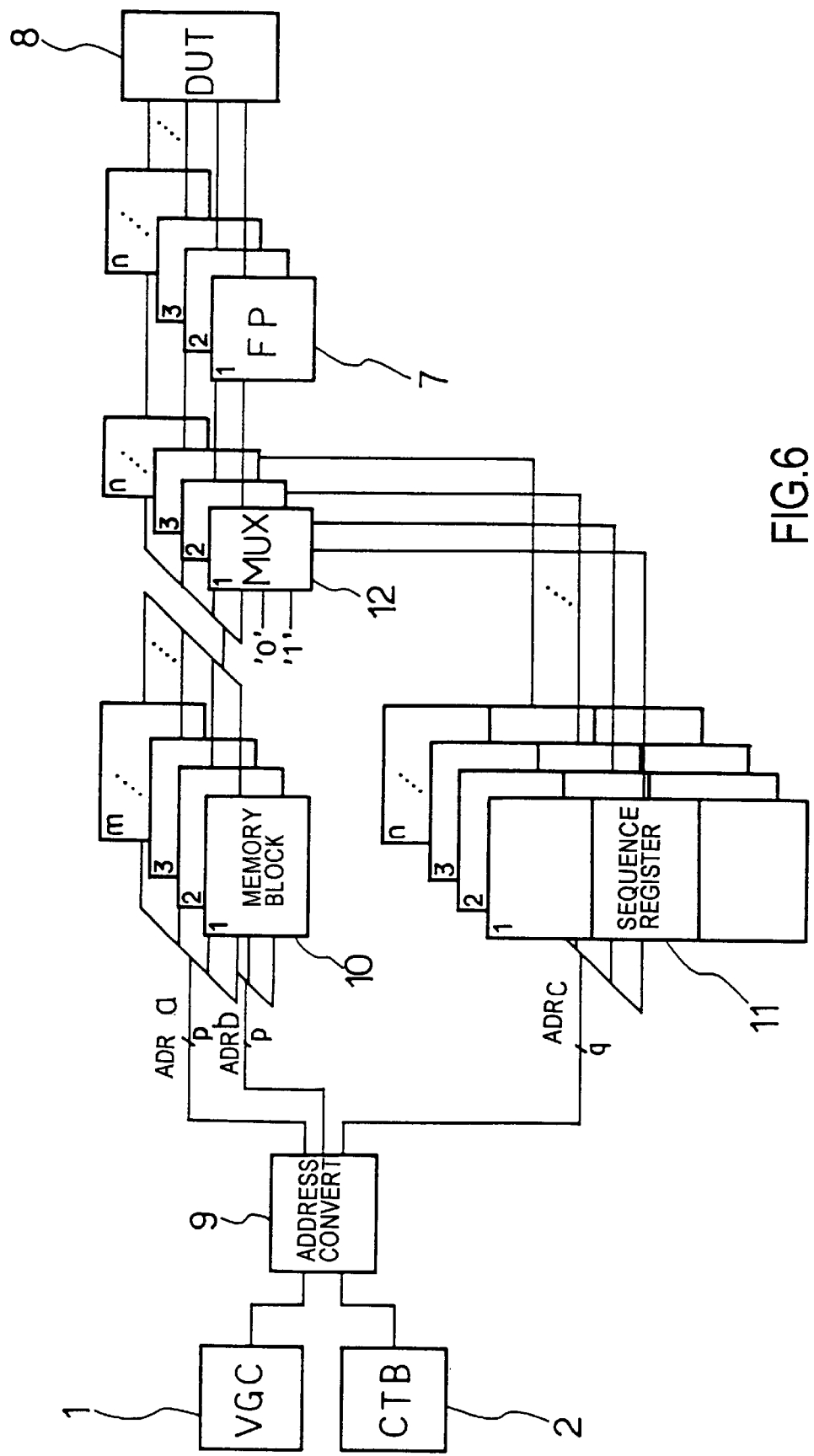
FIG. 6 is a block diagram showing the general configuration of a second embodiment of the pattern generator according to the present invention.

FIG. 6 illustrates in block form the general configuration of a second embodiment of the pattern generator according to the present invention. In this embodiment, the sequence registers 11 are each extended to have a plurality of sequences (in the illustrated example, three sequences), which are selectively used by a similarly extended address c. Accordingly, this embodiment provides increased flexibility of the device tester. Since this embodiment is identical in construction to the first embodiment of FIG. 1 except the above, no further description will be given.

Figure 7:
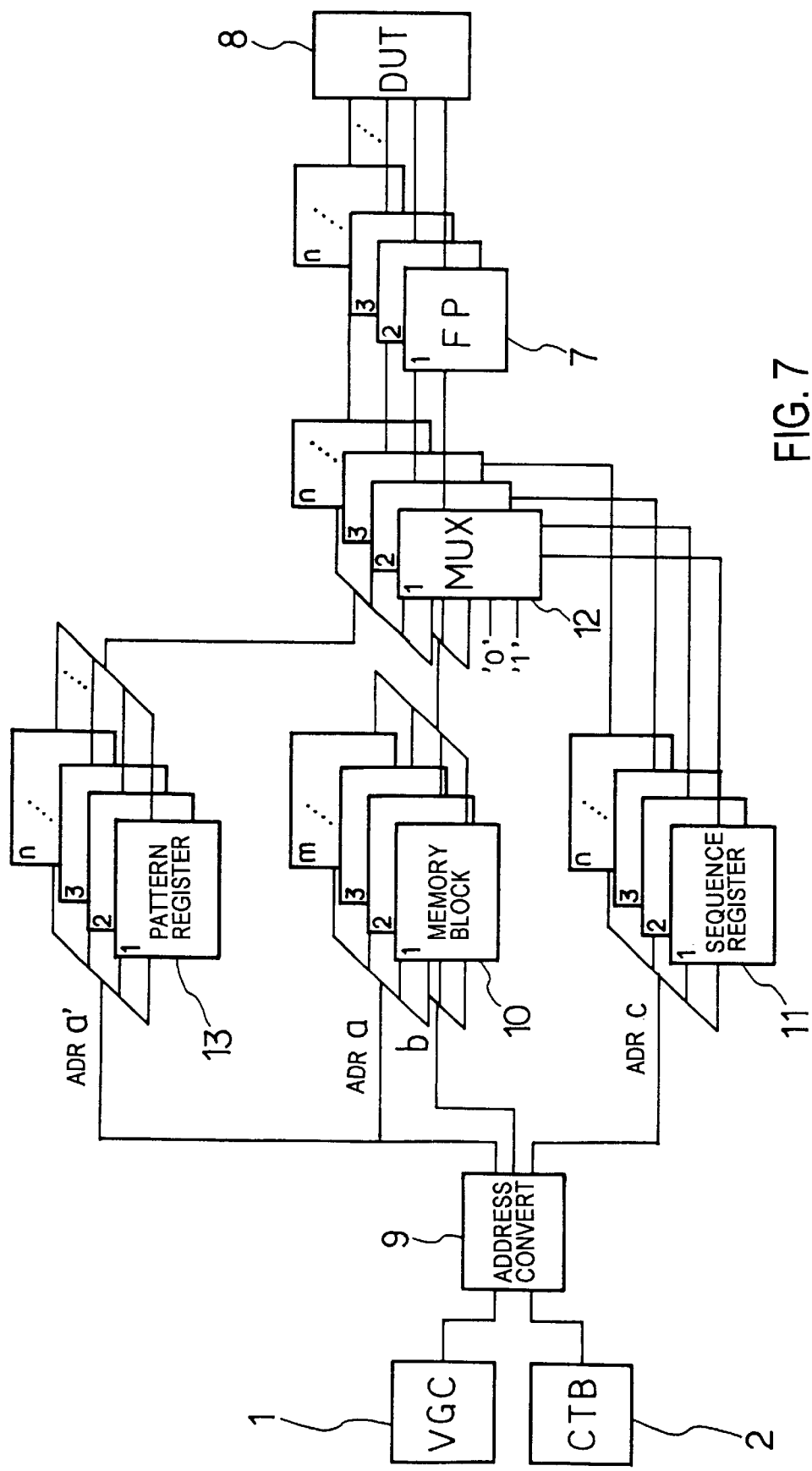
FIG. 7 is a block diagram showing the general configuration of a third embodiment of the pattern generator according to the present invention.

FIG. 7 is a block diagram depicting the general configuration of a third embodiment of the pattern generator according to the present invention. In this embodiment, n (1, 2, ..., n) pattern registers 13 are additionally provided for storing pattern data of small capacity which is output to pins of the DUT 8 other than the test pin to which the scan pattern is applied; the scan pattern is generated by the memory blocks 10 and other patterns are generated by the pattern registers 13. Of course, the patterns other than the scan pattern may also be generated by the memory blocks 10.

The pattern registers 13 are accessed by an address signal a' that has an address width of one pattern register. Since this embodiment is identical in construction to the first embodiment of FIG. 1 except in the above respect, no further description will be given.

Figure 8:
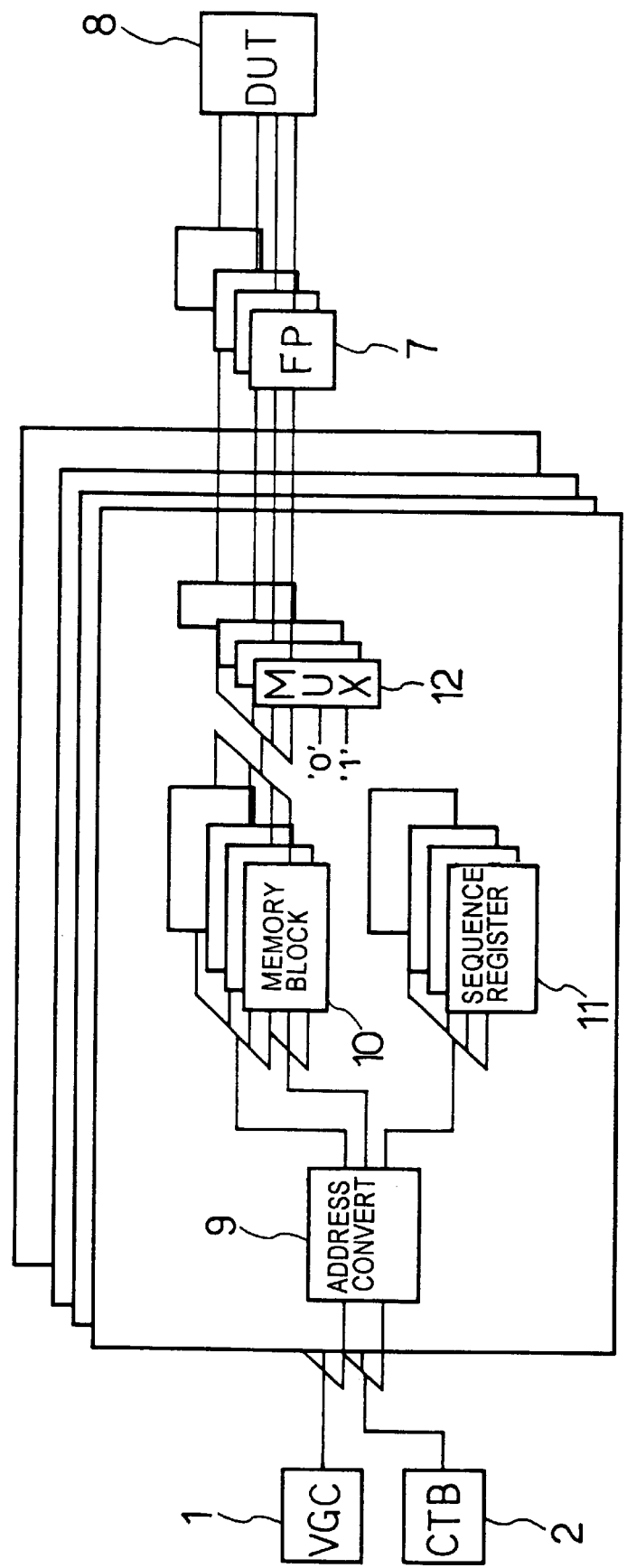
FIG. 8 is a block diagram showing the general configuration of a modification extended from the first embodiment depicted in FIG. 1.
Figure 9:
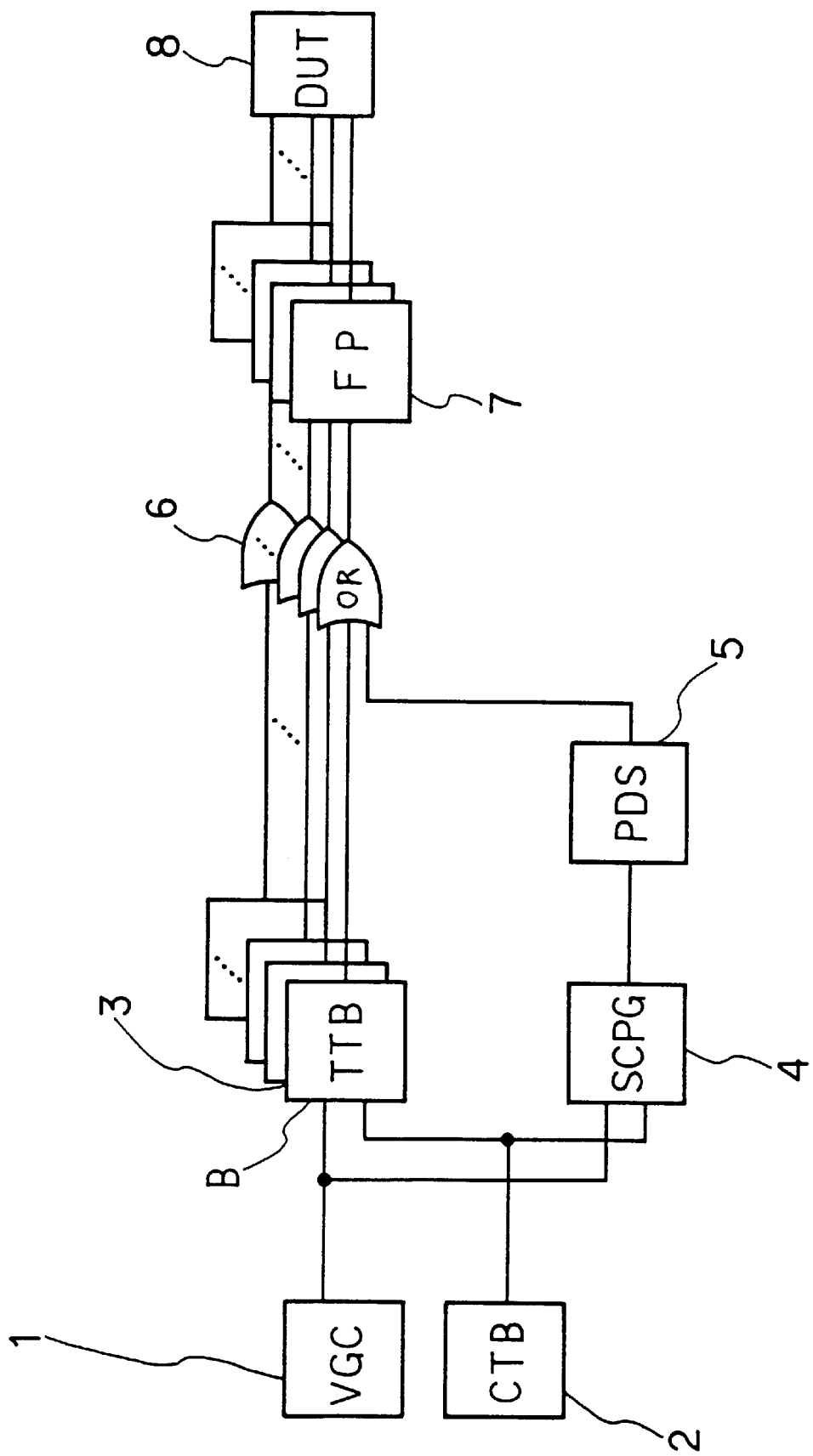
FIG. 9 is a block diagram showing the general configuration of an example of the conventional pattern generator.

FIG. 8 is a block diagram illustrating the general configuration of a modification extended from the first embodiment of FIG. 1. In this modification a plurality of circuits, each composed of the address converter 9, the memory blocks 10, the sequence registers 11 and the multiplexers 12 used in the FIG. 1 embodiment, are provided so that a pattern can be set in each circuit independently of the others. This permits generation of different patterns from the individual circuits, making it possible to test various types of DUTs. Since this modification is also identical in construction to the first embodiment of FIG. 1 except in the above respect, no further description will be given.

It is also possible to suitably combine the configurations of FIGS. 6, 7 and 8. For example, in FIG. 6, a plurality of circuits each made up of the address converter 9, the memory blocks 10, the sequence registers 11 and the multiplexers 12 may be provided so that a pattern can be set in each circuit independently of the others. In FIG. 7 a plurality of circuits each composed of the address 10 converter 9, the memory blocks 10, the sequence registers 11, the multiplexers 12 and the pattern registers may be provided so that a pattern can be set in each circuit independently of the others. The configurations of FIGS. 6 and 7 may also be combined.

As is evident from the description given above, according to the present invention, sequence registers of the same number as that of pins of the DUT provided, the sequence for controlling the order of access to memory blocks having stored therein pattern data is set in each of the sequence registers, and the memory blocks are selected using data of a predetermined sequence from each sequence register to apply a test pattern to a desired pin of the DUT—this permits utilization of memory blocks connected to unused pins of the DUT which have given rise to a problem in the prior art.

Accordingly, the present invention saves the need for providing the scan pattern generator and the programmable selector which are both expensive, and hence the invention cuts the overall costs of the device tester. Further, since test patterns from desired memory blocks can be applied to desired pins of the DUT in a desired order, the present invention provides increased flexibility of the device tester. For example, since the pins of the DUT can be switched by the multiplexers without changing the pattern data, the same pattern data can be used to measure DUTs which differ only in pin arrangement.

Additionally, since the pattern capacity and the maximum operating frequency of the device tester can be changed according to the particular type of the DUT, it is also possible to effectively utilize resources of the device tester and generate a large capacity pattern at high speed.

What is claimed is:

1. A pattern generator comprising:
 address generating means (VGC) for generating a pattern address;
 control signal generating means (CTB) for generating a control signal;

address converting means for converting a pattern address from said address generating means into at least first and second address signals on the basis of a control signal from said control signal generating means, each of the address signals being composed of a plurality of bits;

m memory means (m being an integral multiple of the number n of pins of a semiconductor device under test) each having predetermined pattern data previously stored therein and responsive to said first address signal supplied thereto to generate corresponding pattern data;

n sequence registers responsive to said second address signal supplied thereto to generate data of a preset sequence; and n select means each selecting one of said memory means depending upon the preset sequence data outputted from said sequence registers, and applying to corresponding one of pins of said semiconductor device under test a test pattern based on pattern data stored in the selected memory means.

2. The pattern generator as claimed in claim 1, wherein each of said n sequence registers is constructed such that it can set therein a plurality of sequences, and one of the plurality of sequences is selected from each sequence register depending upon an address signal applied thereto and the selected sequence is supplied to corresponding one of said select means.

3. The pattern generator as claimed in claim 1, further including n pattern storage means each having previously stored therein pattern data for generating a pattern having a relatively small capacity to be supplied to a pin of a semiconductor device under test other than a pin or pins thereof to which a scan pattern is applied, and wherein the scan pattern is generated from said memory means and a pattern or patterns other than the scan pattern are generated from said pattern storage means.

4. The pattern generator as claimed in claim 1, wherein said n select means comprise:

n multiplexers selecting said memory means in accordance with sequence data outputted from said sequence registers, respectively; and n frame processors converting the pattern data stored in said memory means selected by said multiplexers into test patterns each having a waveform suitable for application to a semiconductor device under test, the test patterns being applied to corresponding pins of the semiconductor device under test, respectively.

5. The pattern generator as claimed in claim 1, wherein said address converting means generates, in addition to said first and second address signals, a third address signal for access to said memory means, said third address signal serving to cause said memory means to generate pattern data corresponding to a scan pattern to be supplied to a pin of a semiconductor device under test to which said scan pattern is applied.

6. The pattern generator as claimed in claim 1, wherein said address generating means is a vector generation control for generating an address of pattern data stored in each of said memory means, and said control signal generating means is a control table buffer for generating a control signal for controlling said address converting means, said address converting means being controlled by the control signal from said control table buffer and the address of pattern data from said vector generation control, thereby to generate said address signal, and wherein each of said memory means is a memory block, a selecting order of these memory blocks being previously set in each of said sequence registers as one sequence for each pin of a semiconductor device under test.

7. The pattern generator as claimed in claim 1, wherein said address generating means is a vector generation control for generating an address of pattern data stored in each of said memory means, and said control signal generating means is a control table buffer for generating a control signal for controlling said address converting means, said address converting means being controlled by the control signal from said control table buffer and the address of pattern data from said vector generation control, thereby to generate said address signal, wherein each of said memory means is a memory block, a selecting order of these memory blocks being previously set in each of said sequence registers as one sequence for each pin of a semiconductor device under test, and wherein said n select means comprise: n multiplexers selecting said memory means in accordance with sequence data outputted from said sequence registers, respectively; and n frame processors converting the pattern data stored in said memory means selected by said multiplexers into test patterns each having a waveform suitable for application to a semiconductor device under test, the test patterns being applied to corresponding pins of the semiconductor device under test, respectively.

8. The pattern generator as claimed in claim 4, further including a plurality of circuits each of which is constituted by said address converting means, said memory means, said sequence registers and said multiplexers, and wherein said plurality of circuits being arranged such that a pattern can be generated from each of the circuits independently of others.

* * * * *